United States Patent
Song et al.

(10) Patent No.: US 7,619,697 B2
(45) Date of Patent: Nov. 17, 2009

(54) METHOD FOR FABRICATING THIN FILM PATTERN, LIQUID CRYSTAL DISPLAY PANEL AND METHOD FOR FABRICATING THEREOF USING THE SAME

(75) Inventors: Kye Chan Song, Gyeonggi-do (KR); Kang Il Kim, Seoul (KR)

(73) Assignee: LG. Display Co., Ltd., Seoul (KR)

( * ) Notice: Subject to any disclaimer, the term of this patent is extended or adjusted under 35 U.S.C. 154(b) by 125 days.

(21) Appl. No.: 11/807,231

(22) Filed: May 25, 2007

(65) Prior Publication Data

US 2008/0062369 A1 Mar. 13, 2008

(30) Foreign Application Priority Data

Sep. 11, 2006 (KR) .................. 10-2006-0087383

(51) Int. Cl.
*G02F 1/136* (2006.01)
(52) U.S. Cl. .................. 349/42; 349/143; 427/256; 438/30; 257/E33.001
(58) Field of Classification Search .............. 385/2, 385/27, 37, 129; 349/42, 143; 438/30, 622–623; 257/E33.001; 427/256
See application file for complete search history.

(56) References Cited

U.S. PATENT DOCUMENTS

2002/0050651 A1* 5/2002 Nakagawa et al. .......... 257/774
2004/0188682 A1 9/2004 Hirai
2004/0209190 A1 10/2004 Mori et al.
2006/0159838 A1 7/2006 Kowalski et al.
2007/0252934 A1* 11/2007 Seo et al. .................. 349/138
2008/0164472 A1* 7/2008 Ahn et al. .................. 257/59

FOREIGN PATENT DOCUMENTS

| EP | 1 482 556 A1 | 12/2004 |
| JP | 54076066 | 6/1979 |
| JP | 2006-131953 | 5/2006 |

OTHER PUBLICATIONS

Combined Search and Examination Report for corresponding United Kingdom Application Serial No. GB0709523.5, dated Aug. 20, 2007.
Office Action issued in corresponding German Patent Application No. 10 2007 025 112.4; issued May 12, 2009.

* cited by examiner

*Primary Examiner*—Ellen Kim
(74) *Attorney, Agent, or Firm*—Brinks Hofer Gilson & Lione

(57) ABSTRACT

A method of fabricating a thin film pattern according to an embodiment of the present invention comprises forming an organic material pattern on a substrate, forming a metal material of liquid phase on a substrate provided with the organic material pattern, hardening the metal material of liquid phase, and removing the metal material located on the organic material pattern, allowing some metal material to be left at an area non-overlapped with the organic material pattern.

6 Claims, 13 Drawing Sheets

METHOD FOR FABRICATING THIN FILM PATTERN, LIQUID CRYSTAL DISPLAY PANEL AND METHOD FOR FABRICATING THEREOF USING THE SAME

This application claims the benefit of Korean Patent Application No. P2006-087383, filed in Korea on Sep. 11, 2006, which is hereby incorporated by reference.

FIELD

The present invention relates to a method of fabricating a thin film pattern, and a liquid crystal display panel and a fabricating method thereof using the same that are adaptive for simplifying a process of forming a thin film pattern to reduce fabrication cost and time, and for forming a thin film pattern at an appropriate position to improve reliability and prevent defects.

BACKGROUND

Display devices have become very important as a visual information communicating media in an information society. Cathode Ray Tube (CRT) display devices, which have been the main stream of the display devices, have problems, such as heavy weight and bulky volume.

Flat panel display devices include a liquid crystal display device (hereinafter, referred to as "LCD"), a field emission display (hereinafter, referred to as "FED"), a plasma display panel (hereinafter, referred to as "PDP"), and an electroluminescence (hereinafter, referred to as "EL"), and the like. Most of these flat panel display devices are put to practical use, having significant market share in the display device market.

Such flat panel display devices include a plurality of thin film patterns, and each of the thin film patterns is formed by a photolithography process and an etching process.

FIG. 1 is a diagram illustrating a technique for forming a thin film pattern using the photolithography process and the etching process step by step.

First, a metal layer 4a is formed on a substrate for a flat panel display device 2 by a deposition technique such as sputtering, and the like. Next, the photolithography process including a photo-resist coating, an exposure, and developing processes is carried out to provide a photo-resist pattern 5. The metal layer 4a that did not overlap the photo-resist pattern 5 is removed by a dry or wet etching process using the photo-resist pattern 5 as a mask. Then, the photo-resist pattern 5 is removed by a stripping process to form a first thin film pattern 4.

A plurality of thin film patterns are disposed by the photolithography process, and the thin film patterns are electrically connected to each other or electrically insulated with each other by an electric contact of each of the thin film patterns as occasion demands. Herein, if each of the metal thin film patterns is electrically insulated, an insulating film 6 is formed on the substrate 2 provided with the first thin film pattern 4 as shown in FIG. 2. In this case, the insulating film 6 is formed of an inorganic insulating material such as $SiN_x$ and the like by a deposition technique such as PECVD, and the like.

On the other hand, if a gate pattern such as a gate electrode and a gate line, etc is formed at a liquid crystal display panel by the photolithography process and the etching process in FIG. 1, the wet etching process is used. However, the wet etching process is a method that a metal is exposed to an etchant to be selectively removed. The thin film pattern formed by the wet etching process has a drawback of a large error and deviation because time adjustment is difficult. Accordingly, if the gate pattern is formed by the wet etching process, the gate pattern is inadequately formed from time to time. As a result, when the liquid crystal display panel is complete, and then an image is realized, the gate pattern is not formed at the right position to generate a light leakage problem. Furthermore, although an insulating film is disposed, a step coverage generated by the gate pattern is maintained as it is. Thus, the data line provided on an insulating film may be broken by such step coverage.

The photolithography process and the etching process in FIG. 1 include the stripping process to remove the photo-resist pattern after the exposure process, the developing process, and the etching process are carried out. As a result, a manufacturing cost forming a thin film pattern is increased and a manufacturing time is also increased.

SUMMARY

A method of fabricating a thin film pattern according to an embodiment of the present invention comprises forming an organic material pattern on a substrate, forming a metal material of liquid phase on a substrate provided with the organic material pattern, hardening the metal material of liquid phase, and removing the metal material located on the organic material pattern, allowing some metal material to be left at an area non-overlapped with the organic material pattern.

A liquid crystal display panel according to one embodiment of the present invention comprises a gate pattern that includes a gate line and a gate electrode connected to the gate line on a substrate, an organic gate insulating film disposed on a substrate provided with the gate pattern, and a data line that crosses the gate line with the organic gate insulating film disposed therebetween. The liquid crystal display panel further comprises a thin film transistor provided at a crossing of the data line and the gate line, a pixel electrode connected to the thin film transistor, and an organic material pattern disposed between the substrate and the organic gate insulating film, and located at an area other than the gate pattern.

A method of fabricating a liquid crystal display panel according to another embodiment of the present invention comprises forming an organic material pattern on a substrate, and forming a gate pattern that includes a gate electrode and a gate line connected to the gate electrode at an area non-overlapped with the organic material pattern. The method of fabricating a liquid crystal display panel further comprises forming an organic gate insulating film on the organic material pattern and the gate pattern, forming a data line that crosses the gate line, and a thin film transistor located at a crossing of the gate line and the data line with the organic gate insulating film disposed therebetween, and forming a pixel electrode connected to the thin film transistor.

A liquid crystal display device comprises a liquid crystal display panel. The liquid crystal display panel comprises a gate pattern that includes a gate line and a gate electrode connected to the gate line on a substrate, an organic gate insulating film disposed on the substrate provided with the gate pattern, a data line that crosses the gate line with the organic gate insulating film disposed therebetween, and a thin film transistor provided at a crossing of the data line and the gate line. The liquid crystal display panel further comprises a pixel electrode connected to the thin film transistor, and an organic material pattern disposed between the substrate and the organic gate insulating film, and provided at an area other than the gate pattern.

BRIEF DESCRIPTION OF THE DRAWINGS

These and other objects of the invention will be apparent from the following detailed description of the embodiments of the present invention with reference to the accompanying drawings, in which.

DETAILED DESCRIPTION

Hereinafter, the preferred embodiments of the present invention will be described in detail with reference to FIG. 3A to FIG. 7E.

Figure 1:
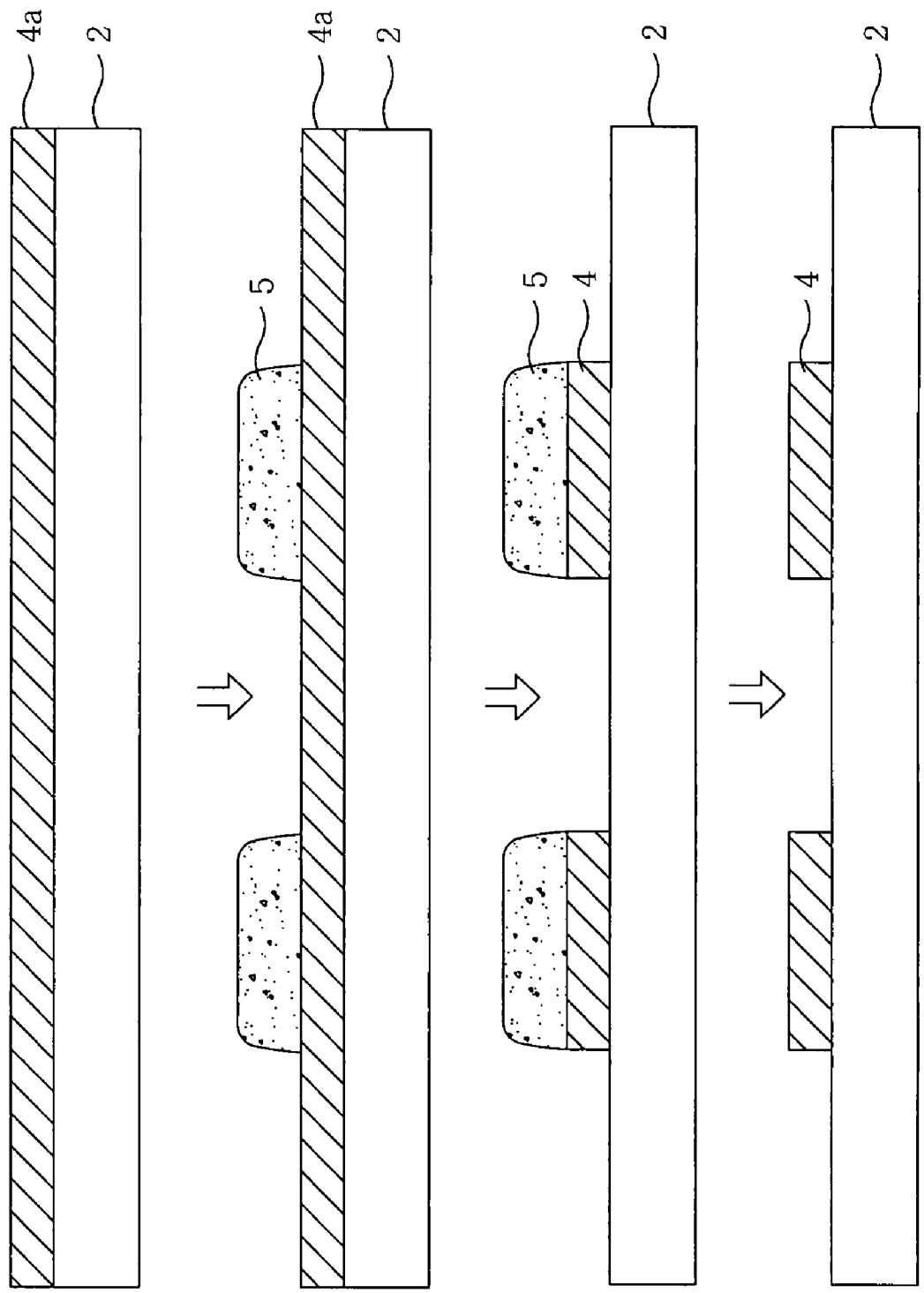
FIG. 1 is a process flow chart illustrating a process of fabricating a thin film pattern by a photolithography process and an etching process step by step.
Figure 2:
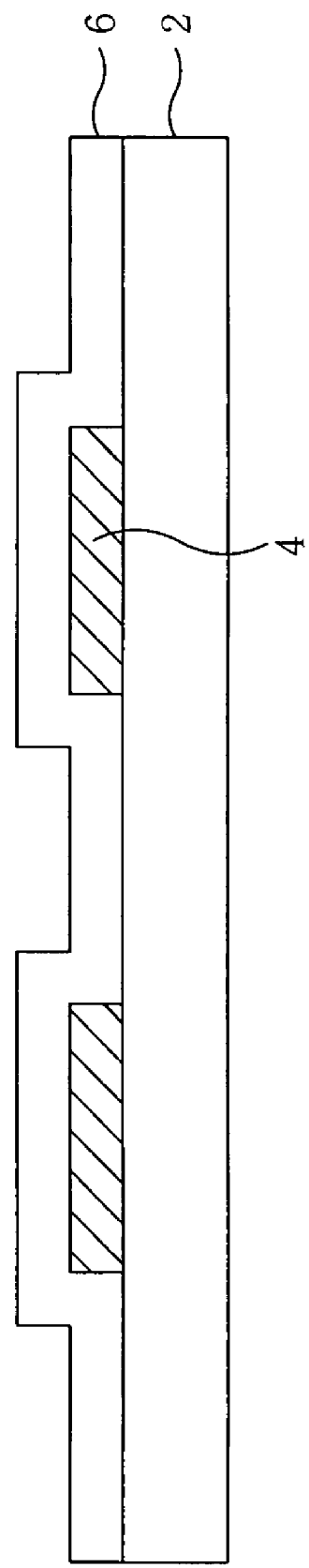
FIG. 2 is a diagram illustrating a condition that an insulating film is formed on a substrate provided with a thin film pattern.
Figure 3A:
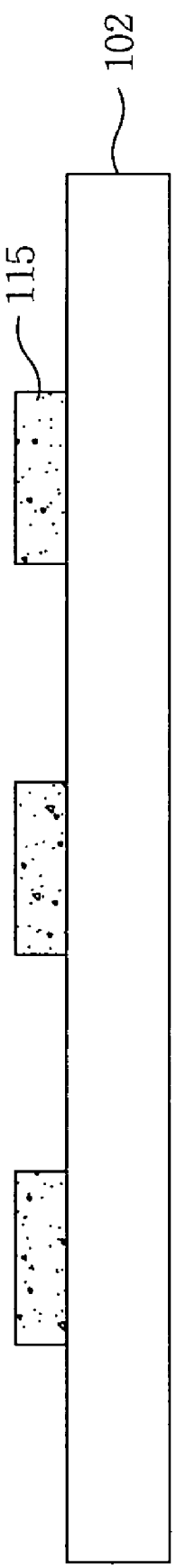
FIG. 3A to FIG. 3C are flow charts illustrating a method of fabricating a thin film pattern according to an embodiment of the present invention.
Figure 3B:
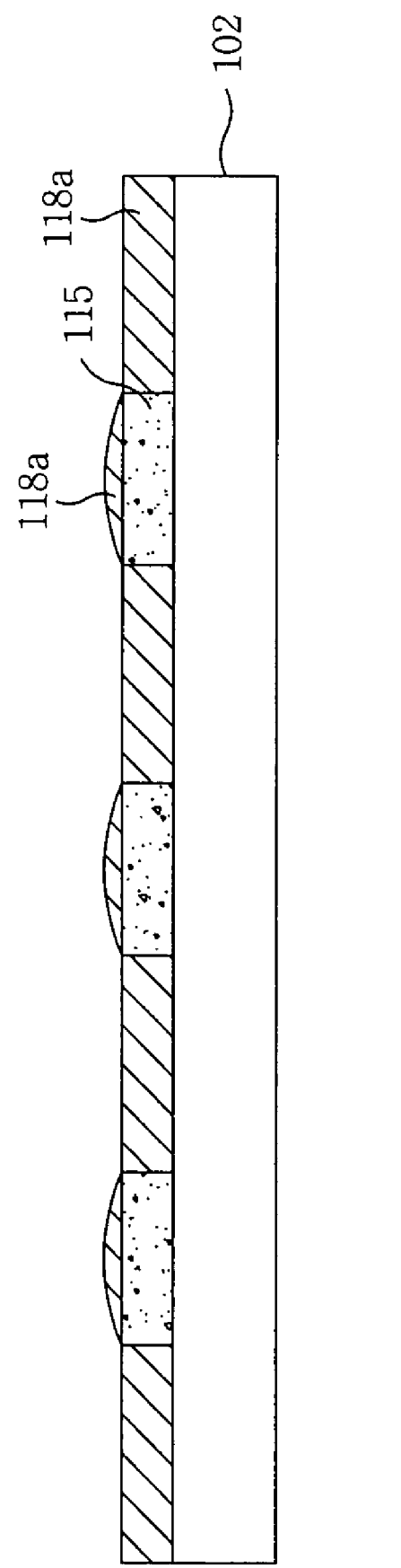
Figure 3C:
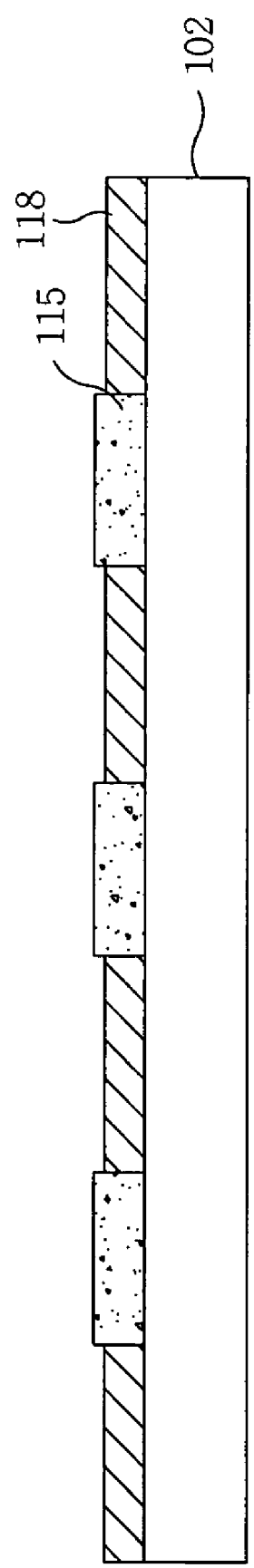

FIG. 3A to FIG. 3C are process flow charts illustrating a method of fabricating a thin film pattern according to an embodiment of the present invention.

First, a substrate 102 is provided, and then a photosensitive organic material such as a photo-acryl and the like is coated on the substrate 102. Next, an organic material pattern 115 is formed on the substrate 102 by a photolithography process including an exposure and developing processes as shown in FIG. 3A.

A metal material 118a of liquid phase is coated on the substrate 102 provided with the organic material pattern 115 by the spray method or the spin coating method. Accordingly, the metal material 118a of liquid phase is directly located on the substrate 102 and the metal material 118a of liquid phase is partially located on the organic material pattern 115 as shown in FIG. 3B. Next, the metal material 118a of liquid phase is hardened by the dry process.

Herein, the metal material of liquid phase is comprised of silver nitrate $AgNO_3$, a reducing agent, a material for protecting a metal particle, and a solvent. Sodium borohydride $NaBH_4$ may be used as the reducing agent, and polyacrylic ammonuim salt may be used as the material for protecting the metal particle.

Next, the metal material 118a located on the organic material pattern 115 is removed by the dry etching process or an ashing process. On the other hand, the metal material 118a directly provided on the substrate 102 as well as the metal material 118a located on the organic material pattern 115 are partially removed by the dry etching process. Thus, the metal material 118a directly located on the substrate 102 has a relatively low thickness before the dry etching process is carried out. Accordingly, a thin film pattern 118 can be formed at an area except for the organic material pattern 115 as shown in FIG. 3C.

Such a method of fabricating the thin film pattern omits the stripping process to remove a related art photo-resist pattern, so that the manufacturing cost and time can be reduced.

Furthermore, the thin film pattern can be provided without the wet etching process, so that a problem generated by carrying out a related art wet etching process can be prevented beforehand. In other words, an error and a deviation are highly decreased by the dry etching process to allow the thin film pattern to be formed at the appropriate position, compared to the thin film pattern formed by the wet etching process.

Figure 4:
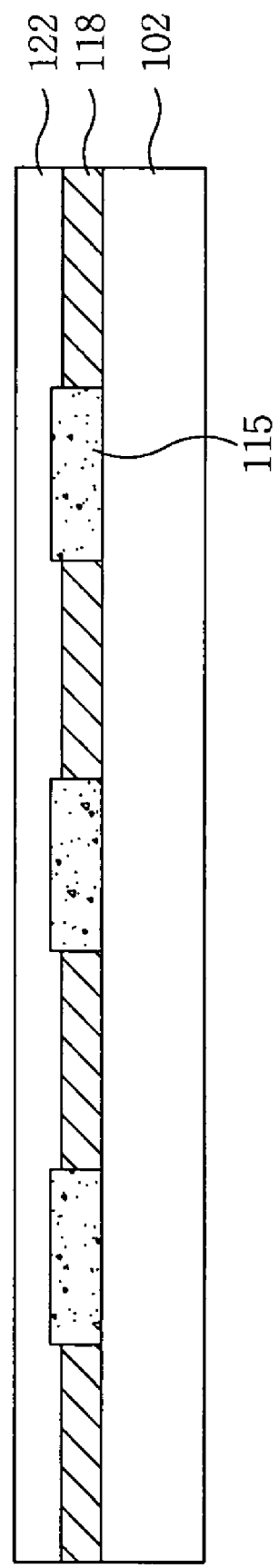
FIG. 4 is a diagram illustrating a condition that an organic insulating film is formed on the thin film pattern provided by FIG. 3A to FIG. 3C.

As described above, the thin film pattern 118 is formed on the substrates 102, and then the organic insulating film 122 is formed as shown in FIG. 4. Unlike an inorganic insulating film, the organic insulating film 122 is formed of an organic material by a spin coating method to offset step coverage between the thin film patterns. Accordingly, thin films are not broken. In this case, the thin films are formed after providing the organic insulating film 122.

Hereinafter, a thin film transistor array substrate of a liquid crystal display panel and a fabricating method thereof will be described with reference to FIG. 5 to FIG. 7E. In this case, the liquid crystal display panel is formed by use of the above-mentioned method of fabricating the thin film pattern.

Figure 5:
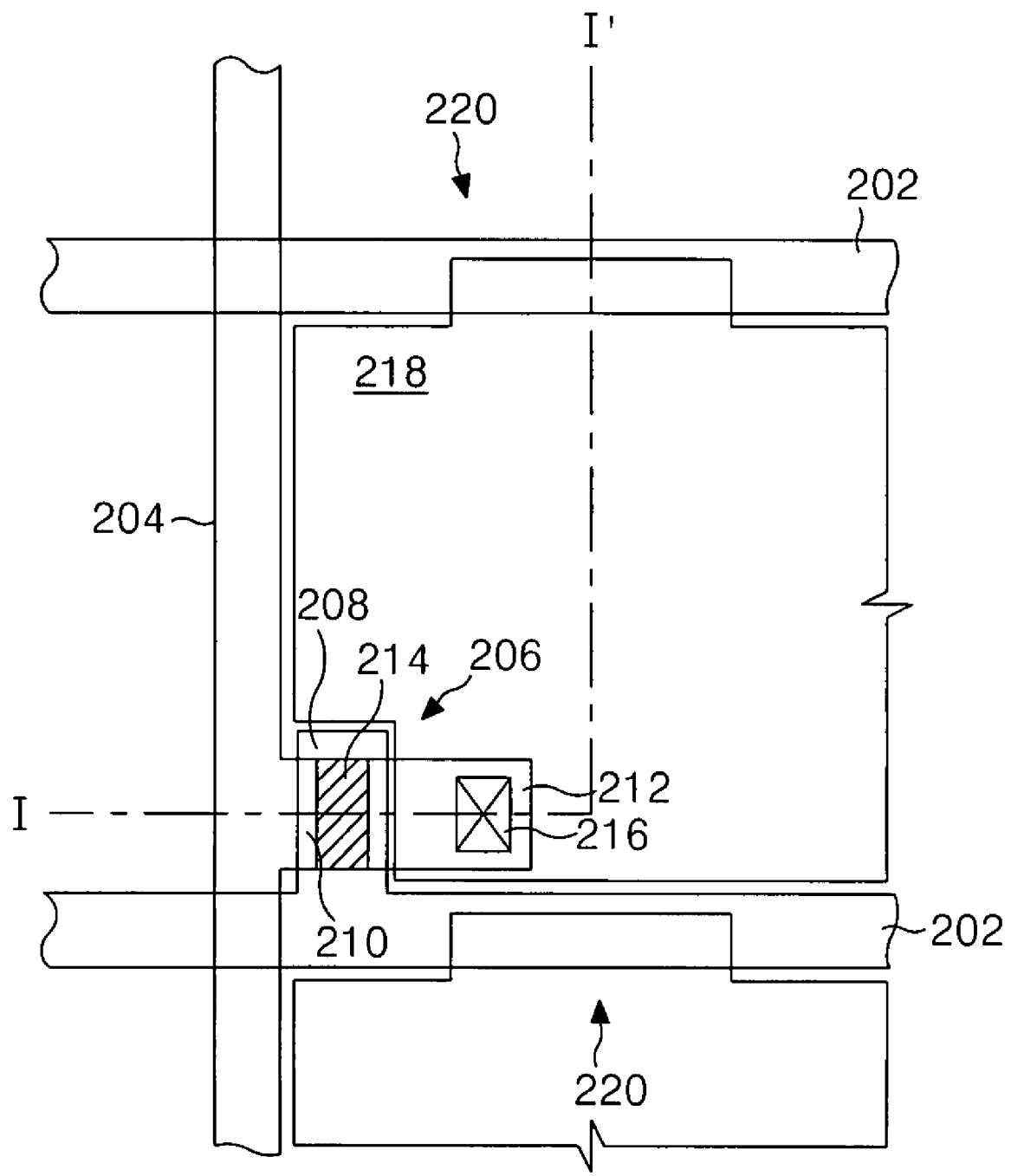
FIG. 5 is a plan view illustrating a thin film transistor array substrate of a liquid crystal display panel according to the embodiment of the present invention.
Figure 6:
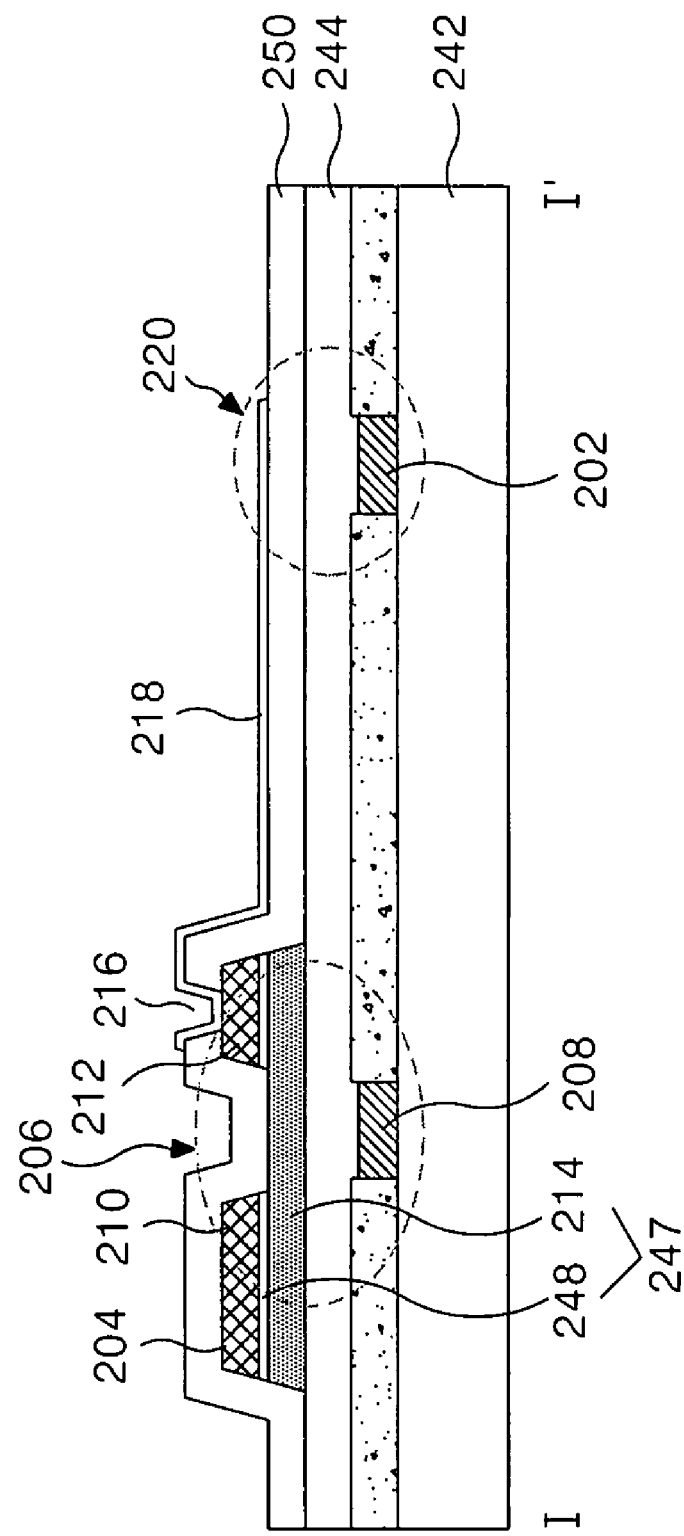
FIG. 6 is a sectional view of the thin film transistor array substrate taken along the I-I' line in FIG. 5.

FIG. 5 is a plan view illustrating a thin film transistor array substrate of a liquid crystal display panel according to one embodiment of the present invention, and FIG. 6 is a sectional view of the thin film transistor array substrate taken along the I-I' line in FIG. 5.

Referring to FIG. 5 and FIG. 6, the thin film transistor array substrate includes a gate pattern disposed on a lower substrate 242, an organic material pattern 230 disposed at an area other than an area where the gate pattern is disposed on the lower substrate 242, an organic gate insulating film 244 disposed on the gate pattern and the organic material pattern 230, a data line 204 that crosses a gate line 202 with the organic gate insulating film 244 disposed therebetween, a thin film transistor 206 disposed at a crossing of the gate line 202 and the data line 204, a pixel electrode 218 disposed at a cell area defined by the gate line 202 and the data line 204 and connected to the thin film transistor 206, and a storage capacitor 220 disposed at an overlapping area of the pixel electrode 218 and the pre-stage gate line 202.

The gate pattern includes a gate electrode 208 of the thin film transistor 206 and the gate line 202 connected to the gate electrode 208, and the organic material pattern 230 is formed at an area non-overlapped with the gate pattern.

An organic material is coated by the spin coating method to form the organic gate insulating film 244. Such an organic gate insulating film offsets step coverage between the gate pattern and the organic material pattern 230 which have a different thickness. Furthermore, the organic gate insulating film 244 electrically separates the gate line 202 from the data line 204.

The thin film transistor 206 includes the gate electrode 208 connected to the gate line 202, a source electrode 210 connected to the data line 204, a drain electrode 212 connected to the pixel electrode 218, and an active layer 214 overlapped with the gate electrode 208 and forming a channel between the source electrode 210 and the drain electrode 212. The active layer 214 is overlapped with the data line 204, the source electrode 210, and the drain electrode 212. Furthermore, the active layer 214 includes a channel portion between the source electrode 210 and the drain electrode 212. An ohmic contact layer 248 in ohmic contact with the data line 204, the source electrode 210, and the drain electrode 212 is further formed on the active layer 214. Herein, the active layer 214 and the ohmic contact layer 248 refer to as a semiconductor pattern 247.

The thin film transistor 206 allows a pixel voltage signal applied to the data line 204 to be charged into the pixel electrode 218 and be kept in response to a gate signal applied to the gate line 202.

The pixel electrode 218 is connected, via a contact hole 216 passing through a protective film 250, to the drain electrode 212 of the thin film transistor 206. The pixel electrode 218 generates a potential difference with respect to a common electrode provided at an upper substrate (not shown) by the charged pixel voltage signal. This potential difference rotates a liquid crystal located between the thin film transistor array substrate and the upper substrate owing to a ∈ anisotropy and transmits a light inputted, via the pixel electrode 218, from a light source (not shown) toward the upper substrate.

The storage capacitor 220 is formed by the pre-stage gate line 202 and the pixel electrode 218. The organic gate insulating film 244 and the protective film 250 are located between the gate line 202 and the pixel electrode 218. The storage capacitor 220 allows the pixel voltage charged in the pixel electrode 218 to be stably maintained until the next pixel voltage is charged.

The gate pattern including the gate line 202 and the gate electrode 208 is formed at the thin film transistor array substrate. In this case, the gate pattern is formed by the method of fabricating the thin film pattern illustrated in FIG. 3A to FIG. 3C. Accordingly, the stripping process to remove the photo-resist pattern can be omitted, so that an entire manufacturing cost and time of the thin film transistor can be reduced.

Furthermore, the gate pattern is not formed by the wet etching process, so that an error and a deviation can be reduced compared to a thin film pattern provided by the related art wet etching process. As a result, when the liquid crystal display panel is completed to realize an image, the gate pattern is formed at the appropriate position, so that the light leakage problem is prevented.

The present invention applies the organic gate insulating film 244 to remove step coverage generated by the gate pattern. As a result, a break or a defect of the data line 204 and the like provided on the organic gate insulating film 244 can be prevented.

Hereinafter, a method of forming the thin film transistor array substrate in FIG. 6 will be described with reference to FIG. 7A to FIG. 7E.

Figure 7A:
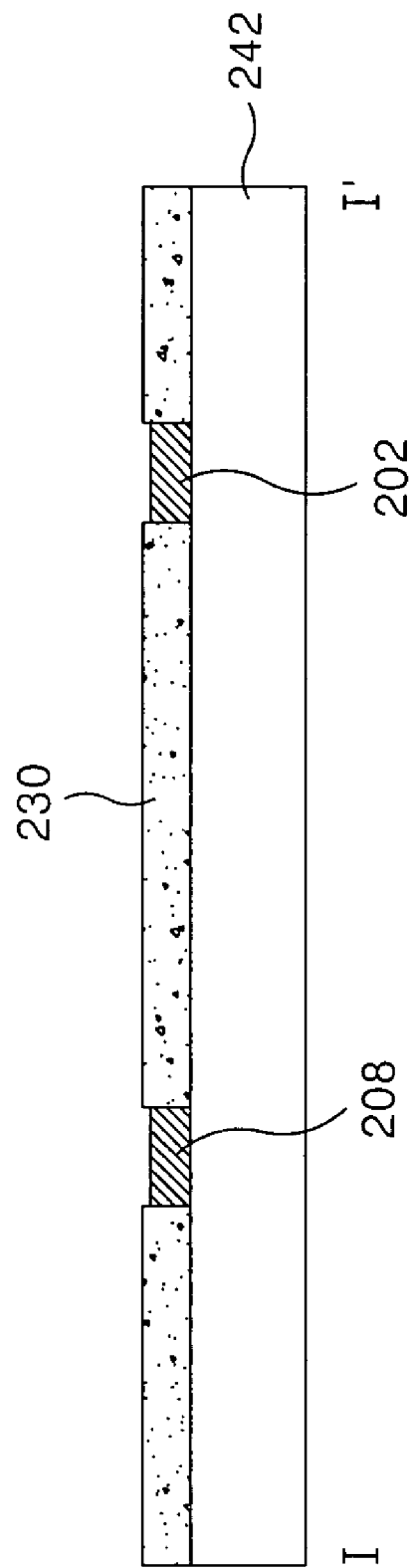
FIG. 7A to FIG. 7E are process flow charts illustrating the process of fabricating the thin film transistor array substrate in FIG. 6 step by step.

Referring to FIG. 7A, the organic material pattern 230, the gate electrode 208, and the gate line 202 are formed on the lower substrate 242 by use of the method illustrated in FIG. 3A to FIG. 3C. In other words, the organic material pattern 230 is formed by the photolithography process, the gate metal material of liquid phase is formed, and the gate metal material located on the organic material pattern is removed. Accordingly, the gate electrode 208 and the gate line 202 are formed at an area non-overlapped with the organic material pattern 230.

Figure 7B:
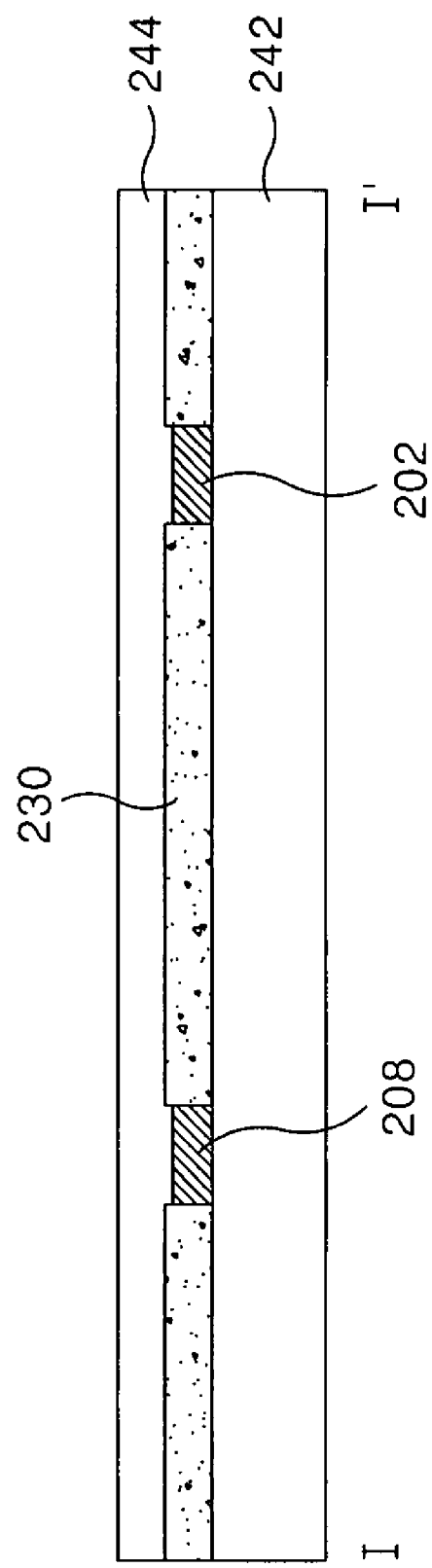

Referring to FIG. 7B, an organic insulating material such as an acrylic group organic compound, BCB, PFCB, or the like is coated on the gate pattern such as the gate electrode 208 and the gate line 202, and the organic material pattern 230, by use of a method such as the spin coating, and the like. Accordingly, the organic gate insulating film 244 is formed on the organic material pattern 230 and the gate pattern.

Herein, a metal material of liquid phase used in FIG. 3A to FIG. 3C may be used as the gate metal material of liquid phase. In other words, the gate metal material of liquid phase includes silver nitrate $AgNO_3$ of about 10% to about 40%, the reducing agent of about 0.1% to about 3%, the material for protecting metal particle of about 5% to about 20%, and the solvent of about 40% to about 85%. Sodium borohydride $NaBH_4$ may be used as the reducing agent, polyacrylic ammonuim salt may be used as the material for protecting metal particle, and water may be used as the solvent.

Figure 7C:
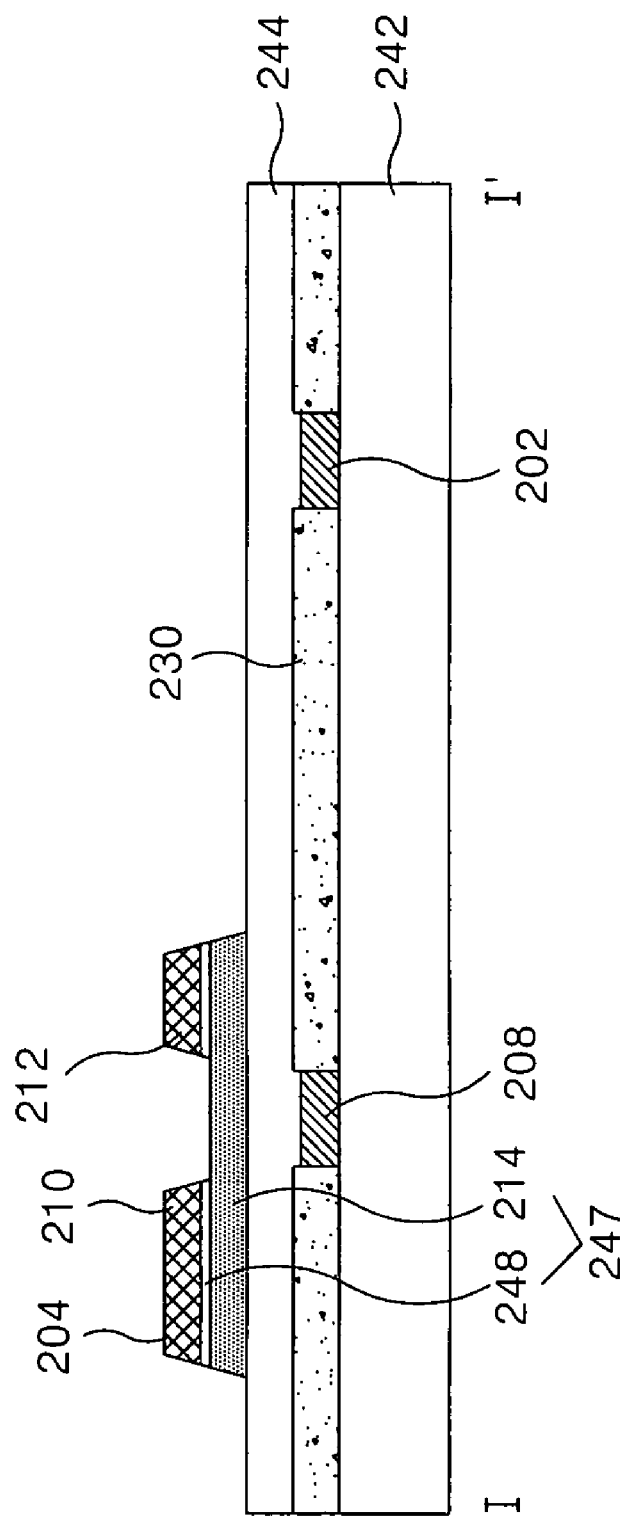

Referring to FIG. 7C, the active layer 214, the ohmic contact layer 248, and source/drain patterns are sequentially formed on the lower substrate 242 provided with the organic gate insulating film 244.

More specifically, an amorphous silicon layer, an amorphous silicon layer doped with an $n^+$ impurity, and the source/drain metal layer are sequentially formed on the lower substrate 242 provided with the organic gate insulating film 244 by the deposition technique such as the PECVD, and the like.

The photo-resist pattern is formed on the source/drain metal layer by the photolithography process using a mask. In this case, the mask uses a diffractive exposure mask having a diffractive exposure part at the channel portion of the thin film transistor to allow the photo-resist pattern of the channel portion to have a thickness lower than another source/drain pattern portion.

Next, the source/drain metal layer is patterned by the wet etching process using the photo-resist pattern to form the source/drain patterns including the data line 204, the source electrode 210, and the drain electrode 212 being integral to the source electrode 210.

Next, the amorphous silicon layer doped with an $n^+$ impurity and the amorphous silicon layer are simultaneously patterned by the dry etching process using the same photo-resist pattern to form the ohmic contact layer 248 and the active layer 214.

Furthermore, the photo-resist pattern having a relatively low thickness at the channel portion is removed by the ashing process, and then the source/drain pattern and the ohmic contact layer 248 of the channel portion are etched by the dry etching process. Accordingly, the source electrode 210 and the drain electrode 212 are electrically separated, and the active layer 214 of the channel portion is exposed. Herein, the ohmic contact layer 248 and the active layer 214 are referred to as the semiconductor pattern 247.

Next, the photo-resist pattern remaining on the source/drain pattern portion is removed by the stripping process.

The source/drain metal is formed from Mo, Ti, Ta, Mo alloy, Cu, and an Al-group metal and the like.

On the other hand, the semiconductor pattern 247 may be formed by use of a separate mask process before forming the source/drain pattern.

Figure 7D:
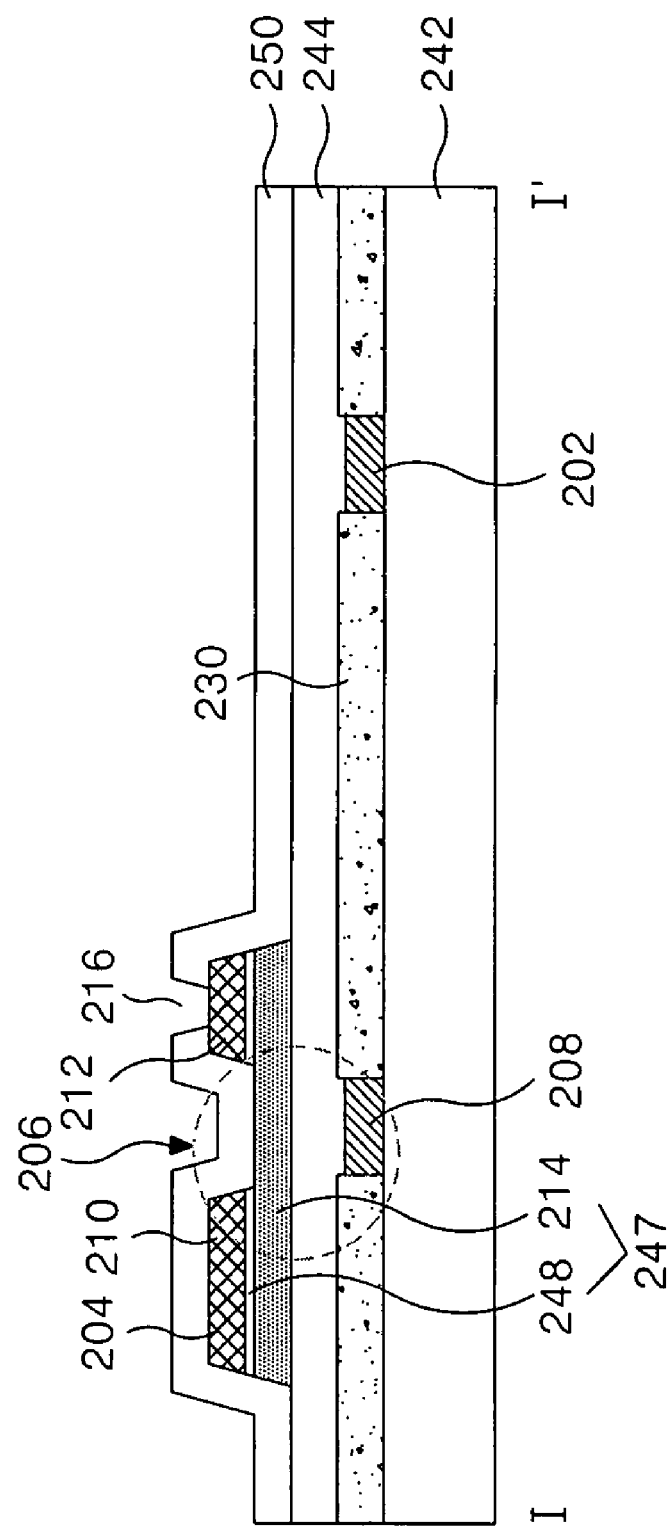

Referring to FIG. 7D, the protective film 250 including the contact hole 216 is formed on the organic gate insulating film 244 provided with the source/drain patterns.

The protective film 250 is entirely formed on the organic gate insulating film 244 provided with the source/drain patterns by the deposition technique such as the PECVD, and the like. Next, the protective film 250 is patterned by the photolithography process and the etching process using the mask to form the contact hole 216 exposing the drain electrode 210 of the thin film transistor 206.

The protective film 250 is made from an inorganic insulating material, or an organic insulating material such as the acrylic group organic compound having a small dielectric constant, BCB, PFCB, or the like.

Figure 7E:
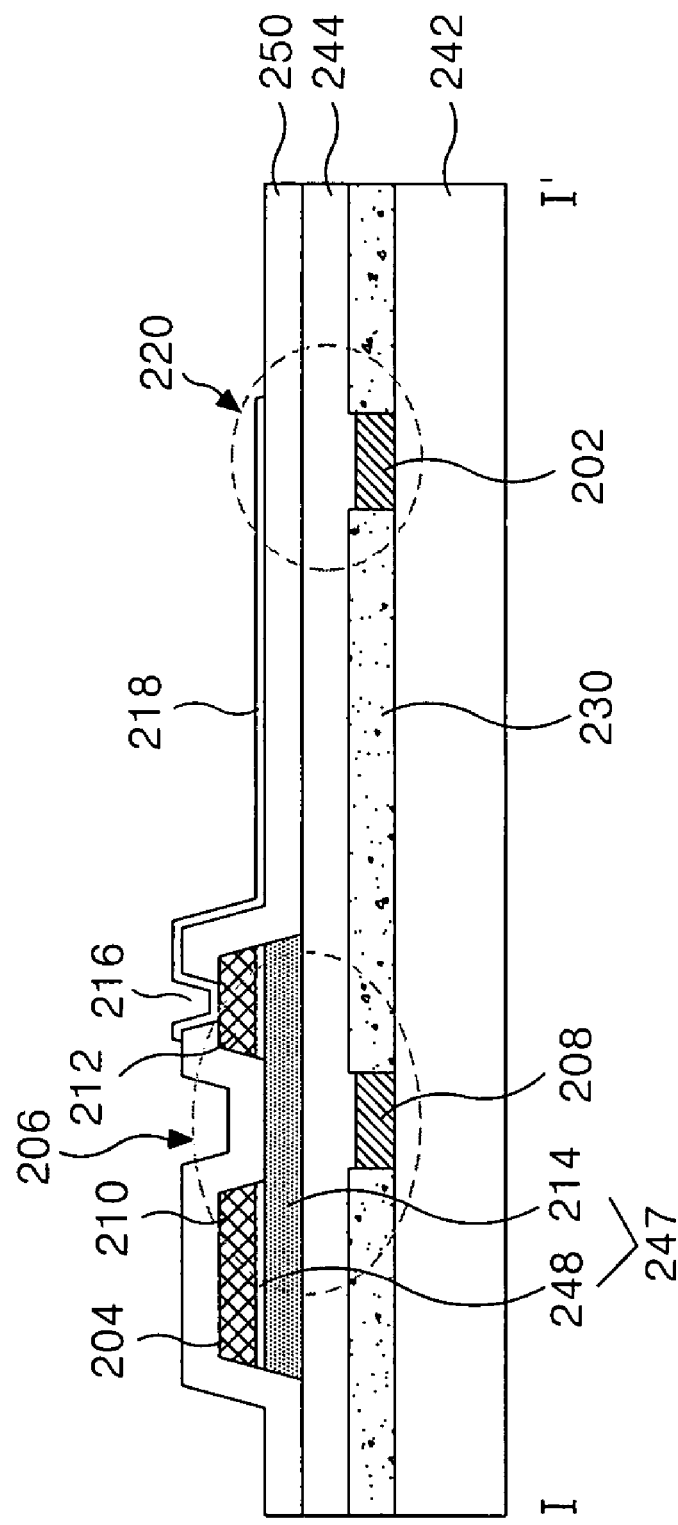

Referring to FIG. 7E, the pixel electrode 218 is formed on the protective film 250.

A transparent electrode material is entirely disposed on the protective film 250 by the deposition technique such as sputtering, and the like. Next, the transparent electrode material is patterned by the photolithography process and the etching process using the mask to form the pixel electrode 218. The pixel electrode 218 is electrically connected, via the contact hole 216, to the drain electrode 212. Furthermore, an area having a relatively low thickness of the organic gate insulating film 244 and the protective film 250 are formed between the pixel electrode 218 and the pre-stage gate line 202 to comprise the storage capacitor 220. The transparent electrode material is made from any one of indium tin oxide (ITO), tin oxide (TO), and indium zinc oxide (IZO).

Herein, the source/drain pattern such as the data electrode 104, the source and drain electrodes 210 and 212, and the like may also be formed by the method of forming the thin film pattern described in FIG. 3A to FIG. 3C.

Furthermore, the method of fabricating the thin film pattern is not limited to the liquid crystal display LCD, and may be used for a process of the display devices such as the field emission display FED, the plasma display panel PDP, the electro-luminescence EL, and the like.

As described above, the method of fabricating the thin film pattern omits the stripping process to remove the photo-resist pattern, so that the manufacturing cost and time can be reduced.

In the liquid crystal display panel and the fabricating method thereof using the method of fabricating the thin film pattern, the gate pattern including the gate line and the gate electrode is not formed by the wet etching process, so that an error and a deviation can be highly reduced compared to a thin film pattern provided by the related art wet etching process. Accordingly, the preset invention forms the thin film pattern at the appropriate position to improve reliability of the thin film pattern, and forms the gate pattern at the appropriate position to prevent a light leakage.

Furthermore, the method according to one embodiment of the present invention applies the organic gate insulating film to remove step coverage generated by the gate pattern. As a result, a break or a defect of the data line, and the like provided on the organic gate insulating film can be prevented.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A method of fabricating a thin film pattern, the method comprising:
    forming an organic material pattern on a substrate;
        forming a metal material of liquid phase on the substrate provided with the organic material pattern;
        hardening the metal material of liquid phase; and
        removing the metal material located on the organic material pattern, and allowing some metal material to be left at an area non-overlapped with the organic material pattern.

2. The method of fabricating the thin film pattern as claimed in claim 1, wherein the metal material of liquid phase is formed by any one of a spray method and a spin coating method.

3. The method of fabricating the thin film pattern as claimed in claim 1, wherein the reducing agent is sodium borohydride.

4. The method of fabricating the thin film pattern as claimed in claim 1, wherein the material for protecting metal particles is a polyacrylic ammonuim salt.

5. The method of fabricating the thin film pattern as claimed in claim 1, wherein water is used as the solvent.

6. The method of fabricating the thin film pattern as claimed in claim 1, further comprising forming an organic insulating film on the substrate provided with the organic material pattern and the metal material at the area non-overlapped with the organic material pattern by a spin coating method.

* * * * *

UNITED STATES PATENT AND TRADEMARK OFFICE
CERTIFICATE OF CORRECTION

| | | |
|---|---|---|
| PATENT NO. | : 7,619,697 B2 | Page 1 of 1 |
| APPLICATION NO. | : 11/807231 | |
| DATED | : November 17, 2009 | |
| INVENTOR(S) | : Kye Chan Song et al. | |

It is certified that error appears in the above-identified patent and that said Letters Patent is hereby corrected as shown below:

In the Claims

In column 8, claim 1, line 19, after "material" replace "pattern." with --pattern, wherein the metal material of liquid phase includes silver nitrate $AgNO_3$ of about 10% to about 40%, a reducing agent of about 0.1% to about 3%, a material for protecting metal particles of about 5% to about 20%, and a solvent of about 40% to about 85%.--.

Signed and Sealed this
Twenty-fourth Day of May, 2011

David J. Kappos
*Director of the United States Patent and Trademark Office*